US007650542B2

(12) United States Patent
Sweet et al.

(10) Patent No.: US 7,650,542 B2
(45) Date of Patent: Jan. 19, 2010

(54) METHOD AND SYSTEM OF USING A SINGLE EJTAG INTERFACE FOR MULTIPLE TAP CONTROLLERS

(75) Inventors: James Douglas Sweet, Sunnyvale, CA (US); Tianwen Tang, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 675 days.

(21) Appl. No.: 11/013,586

(22) Filed: Dec. 16, 2004

(65) Prior Publication Data
US 2006/0156099 A1   Jul. 13, 2006

(51) Int. Cl.
G01R 31/28 (2006.01)
G11C 29/00 (2006.01)
G01R 31/26 (2006.01)

(52) U.S. Cl. .................................... 714/724
(58) Field of Classification Search ............ None
See application file for complete search history.

(56) References Cited

U.S. PATENT DOCUMENTS

| 5,130,988 | A | * | 7/1992 | Wilcox et al. | 714/727 |
|---|---|---|---|---|---|
| 5,828,825 | A | * | 10/1998 | Eskandari et al. | 714/27 |
| 6,085,275 | A | * | 7/2000 | Gallup et al. | 710/316 |
| 6,314,530 | B1 | * | 11/2001 | Mann | 714/38 |
| 6,324,614 | B1 | * | 11/2001 | Whetsel | 714/726 |
| 6,408,413 | B1 | * | 6/2002 | Whetsel | 714/727 |
| 6,425,100 | B1 | * | 7/2002 | Bhattacharya | 714/724 |
| 6,484,273 | B1 | * | 11/2002 | Chang | 714/30 |
| 6,594,741 | B1 | * | 7/2003 | Chang | 711/156 |
| 6,691,270 | B2 | * | 2/2004 | Blasco et al. | 714/729 |
| 6,694,489 | B1 | * | 2/2004 | Case et al. | 716/1 |
| 6,715,105 | B1 | * | 3/2004 | Rearick | 714/30 |
| 6,775,793 | B2 | * | 8/2004 | Deao et al. | 714/29 |
| 6,829,730 | B2 | * | 12/2004 | Nadeau-Dostie et al. | 714/30 |
| 6,912,606 | B2 | * | 6/2005 | Fay | 710/64 |
| 6,979,774 | B2 | * | 12/2005 | Abe et al. | 174/377 |
| 7,036,058 | B1 | * | 4/2006 | Miyachi et al. | 714/724 |
| 7,039,839 | B2 | * | 5/2006 | Gass | 714/724 |
| 7,065,675 | B1 | * | 6/2006 | Thekkath et al. | 714/30 |
| 7,093,153 | B1 | * | 8/2006 | Witek et al. | 713/600 |
| 7,178,133 | B1 | * | 2/2007 | Thekkath | 717/128 |
| 7,181,728 | B1 | * | 2/2007 | Thekkath | 717/128 |
| 7,210,063 | B2 | * | 4/2007 | Holcroft et al. | 714/27 |
| 7,254,720 | B1 | * | 8/2007 | Giles et al. | 726/26 |
| 2001/0038348 | A1 | * | 11/2001 | Suzuki et al. | 341/55 |
| 2002/0124216 | A1 | * | 9/2002 | Blasco et al. | 714/726 |
| 2002/0162063 | A1 | * | 10/2002 | Whetsel | 714/724 |
| 2002/0184562 | A1 | * | 12/2002 | Nadeau-Dostie et al. | 714/30 |
| 2002/0188782 | A1 | * | 12/2002 | Fay | 710/110 |

(Continued)

*Primary Examiner*—Kevin L Ellis
*Assistant Examiner*—Guerrier Merant
(74) *Attorney, Agent, or Firm*—McAndrews, Held, Malloy, Ltd.

(57) ABSTRACT

Aspects of a method and system of using a single EJTAG interface for multiple TAP controllers may comprise communicating information to a plurality of debugging interfaces, the method comprising simultaneously broadcasting a single debug message to a plurality of TAP controllers where the debug message is received via a single debug interface. The method may further comprise simultaneously broadcasting the single debug message to selected ones of a plurality of TAP controllers. An input enable register control signal may be generated that selects which, of a plurality of TAP controllers, is to receive the debug message. The single debug interface may be a JTAG interface which is capable of receiving and sending JTAG messages, or EJTAG messages.

28 Claims, 4 Drawing Sheets

U.S. PATENT DOCUMENTS

2003/0131296 A1* 7/2003 Park et al. .................. 714/727
2005/0050414 A1* 3/2005 Whetsel ...................... 714/724
2006/0059286 A1* 3/2006 Bertone et al. .............. 710/260
2006/0107160 A1* 5/2006 Ricchetti et al. ............ 714/742
2006/0225050 A1* 10/2006 Thekkath .................... 717/128

* cited by examiner

METHOD AND SYSTEM OF USING A SINGLE EJTAG INTERFACE FOR MULTIPLE TAP CONTROLLERS

CROSS-REFERENCE TO RELATED APPLICATIONS/INCORPORATION BY REFERENCE

Not Applicable.

FIELD OF THE INVENTION

Certain embodiments of the invention relate to on-chip debugging. More specifically, certain embodiments of the invention relate to a method and system of using a single EJTAG interface for multiple TAP controllers.

BACKGROUND OF THE INVENTION

In some conventional systems, design for testability is a core principle. This may include design techniques which enable testing to be done quickly and cost effectively, and to identify the source of any faults that may impair the normal operation of the system. One of the first standards for integrated circuit (IC) components was initiated in 1985 by an ad hoc group composed of representatives from key electronics manufacturers which called itself the Joint Action Test Group (JTAG). The agreements developed by this group were eventually adopted as a standard by the Institute of Electrical and Electronics Engineers (IEEE) in resolution IEEE 1149.1-1990, "IEEE Standard Test Access Port and Boundary-Scan Architecture", a standard which is more commonly known by the eponymous name "JTAG".

IC devices which implement JTAG may have two fundamental modes of operation: normal mode, in which signals pass from normal inputs to normal outputs, and boundary scan mode, generally used for testing, in which signals may be input to an IC via the JTAG input debug interface and output from the device via the JTAG output debug interface. JTAG defines a physical debug interface known as a test access port (TAP) which comprises 4, and optionally 5 serial interfaces. Test data input (TDI) is the serial interface through which debug messages are sent to an IC device. Test data output (TDO) is the serial interface through which debug messages are output from an IC device. Test mode select (TMS) which is a signal that sets the operating mode for the device when executing in boundary scan mode. Finally, test clock (TCLK) which provides the operating clock for devices in boundary scan mode. An optional input on the TAP interface is the test reset (TRST) which interrupts an ongoing boundary scan test sequence.

Debug messages may consist of instructions and data which are sent via the TDI or received via the TDO. Debug messages may be processed within an IC by a JTAG TAP controller which is responsible for the execution of JTAG instructions on the IC device. The destination for debug messages may be a series of registers within the IC. These may include an instruction register, where a JTAG instruction may select one of a plurality of data registers which are to receive data from the TDI and to output data to the TDO. A third type of register is referred to as a bypass register. When this register is selected, the IC may ignore debug messages. Instructions which are not recognized as legitimate JTAG instructions by the JTAG TAP controller may result in subsequent debug messages being ignored by the IC.

As circuit boards and devices become more complex and made use of inexorably more complicated embedded processors, efforts arose to adapt JTAG for use with embedded hardware and software systems. While these adaptations used many of the same concepts, and even signal names, from JTAG, they had different objectives. JTAG may be largely concerned with validating electrical continuity in boards and in IC devices, while JTAG adaptations for embedded systems may seek to extend capabilities found in in-circuit emulation (ICE) systems to devices in which a processor core resides on a system on a chip (SOC) device where the pins from the SOC may not provide direct connectivity to the processor core. One notable JTAG adaptation is known as enhanced (or alternately, extended) JTAG, or EJTAG. EJTAG provides capabilities to set hardware and software breakpoints, to single step through executable code, and to access the contents of internal registers and on-chip memory areas. EJTAG may allow the debug software to be resident in application software, or in an external EJTAG probe. In the latter case, references to the virtual memory area assigned to EJTAG memory are converted into transactions on the TAP interface. EJTAG may use a TAP interface in which signals have the same names and definitions as in the JTAG TAP The EJTAG TAP controller may be responsible for the execution of EJTAG instructions on the processor core. The JTAG instruction set may contain no instruction codes which are recognizable as legitimate EJTAG instruction codes. Similarly the EJTAG instruction set may contain no instruction codes which are recognizable as legitimate JTAG instruction codes. Thus, a JTAG TAP controller may ignore received debug messages which contain EJTAG instructions, while a EJTAG TAP controller may ignore received debug messages which contain JTAG instructions.

In an example of operation, the EJTAG probe may poll an EJTAG control register through the TAP. The EJTAG control register may contain information that indicates when a processor action is pending. The physical address of the transaction may be available in the EJTAG address register. The EJTAG data register is then accessed by the EJTAG probe to get data if the desired action is a write, and to provided data if the desired action is a read. The EJTAG control register may be subsequently updated to indicate that the processor action has been completed.

As embedded systems become ever more complex, systems on chips (SOCs) are evolving to include multiple processor cores in the same device. In some application specific standard products (ASSP) targeted for secure wireless communications applications, a device may contain a general purpose processor core and an ancillary processor core which is adapted for digital signal processing (DSP). These multiple processor core architectures present a number of challenges for on-chip debugging. A conventional method of on-chip debugging of a SOC with two processor cores, where GP1 refers to a general purpose processor core, and SP2 refers to an application specific processor core, may involve a configuration in which GP1 and SP2 are daisy chained. This may entail coupling the TDI from an EJTAG probe to the TDI at GP1, the TDO from GP1 being coupled to the TDI at SP2, and the TDO from SP2 being coupled to the TDO at the EJTAG probe. Such chaining of EJTAG and/or JTAG components is also known as a scan chain.

As scan chains become longer with ever increasing numbers of processor cores being included in a single SOC device, the speed of EJTAG access to some processor cores may become a limitation to effective on-chip debugging. An alternative to a long scan chain may be to divide the chain into a plurality of shorter scan chains but this may result in increased device pin count to enable access to multiple scan chains. In addition, a plurality of JTAG interfaces in a single device may require additional external debugging hardware, and circuitry adapted to controlling the selection of JTAG interfaces to test at any given instant in time.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention provide a method and system of using a single EJTAG interface for multiple TAP controllers. Aspects of the method may comprise simultaneously broadcasting a single debug message to a plurality of TAP controllers where the debug message is received via a single debug interface. The method may further comprise simultaneously broadcasting the single debug message to selected ones of a plurality of TAP controllers. An input enable register control signal may be generated that selects which, of a plurality of TAP controllers, is to receive the debug message. The single debug interface may be a JTAG interface which is capable of receiving and sending JTAG messages, or EJTAG messages.

The method may further comprise simultaneously receiving a plurality of debug messages from at least a portion of the plurality of TAP controllers. A plurality of TDO output enable signals may be simultaneously received from at least a portion of the plurality of TAP controllers. An EJTAG router output select register control signal may be generated to select a muxed TDO message from at least one of the plurality of debug messages. An EJTAG router output select register control signal may be generated to select a muxed TDO output enable signal from at least one of the plurality of TDO output enable signals. The method may further comprise selecting an interface TDO message from at least one of a main TDO message and the muxed TDO message. An interface TDO output enable signal may be selected from at least one of a main TDO output enable signal and the muxed TDO output enable signal. A main TAP controller output select register control signal may be generated based upon the single debug message received via the debug interface. The method may comprise controlling the sending of an interface TDO message to the single debug interface via an interface TDO output enable signal.

Aspects of a system of using a single EJTAG interface for multiple TAP controllers may comprise circuitry that communicates information to a plurality of debugging interfaces, the system comprising circuitry that simultaneously broadcasts a single debug message to a plurality of TAP controllers where the debug message is received via a single debug interface. The system may further comprise circuitry that simultaneously broadcasts the single debug message to selected ones of a plurality of TAP controllers. An input enable register control signal may be generated that selects which, of a plurality of TAP controllers, is to receive the debug message. The single debug interface may be a JTAG interface which is capable of receiving and sending JTAG messages, or EJTAG messages.

The system may further comprise circuitry that simultaneously receives a plurality of debug messages from at least a portion of the plurality of TAP controllers. Circuitry may also be provided that is adapted to simultaneously receives a plurality of TDO output enable signals from at least a portion of the plurality of TAP controllers. Circuitry that generates an EJTAG router output select register control signal to select a muxed TDO message from at least one of the plurality of debug messages may also be provided. In addition, the system may comprise circuitry that generates an EJTAG router output select register control signal to select a muxed TDO output enable signal from at least one of the plurality of TDO output enable signals. Circuitry that selects an interface TDO message from at least one of a main TDO message and the muxed TDO message may be provided. Circuitry may be provided that selects an interface TDO output enable signal from at least one of a main TDO output enable signal and the muxed TDO output enable signal. The system may furthermore comprise circuitry that generates a main TAP controller output select register control signal based upon the single debug message received via the debug interface. Circuitry is provided that controls the sending of an interface TDO message to the single debug interface via an interface TDO output enable signal.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system of using a single EJTAG interface for multiple TAP controllers. In one aspect of the invention, an EJTAG router may provide an interface between a single JTAG TAP interface, and a plurality of TAP controllers. The EJTAG router may exist in the same scan chain with JTAG TAP controllers, or there may be separate JTAG and EJTAG scan chains. In the event that there is a plurality of scan chains sharing a single JTAG TAP interface, output selector circuitry may be adapted to select a TDO output signal from the plurality of scan chains.

Figure 1:
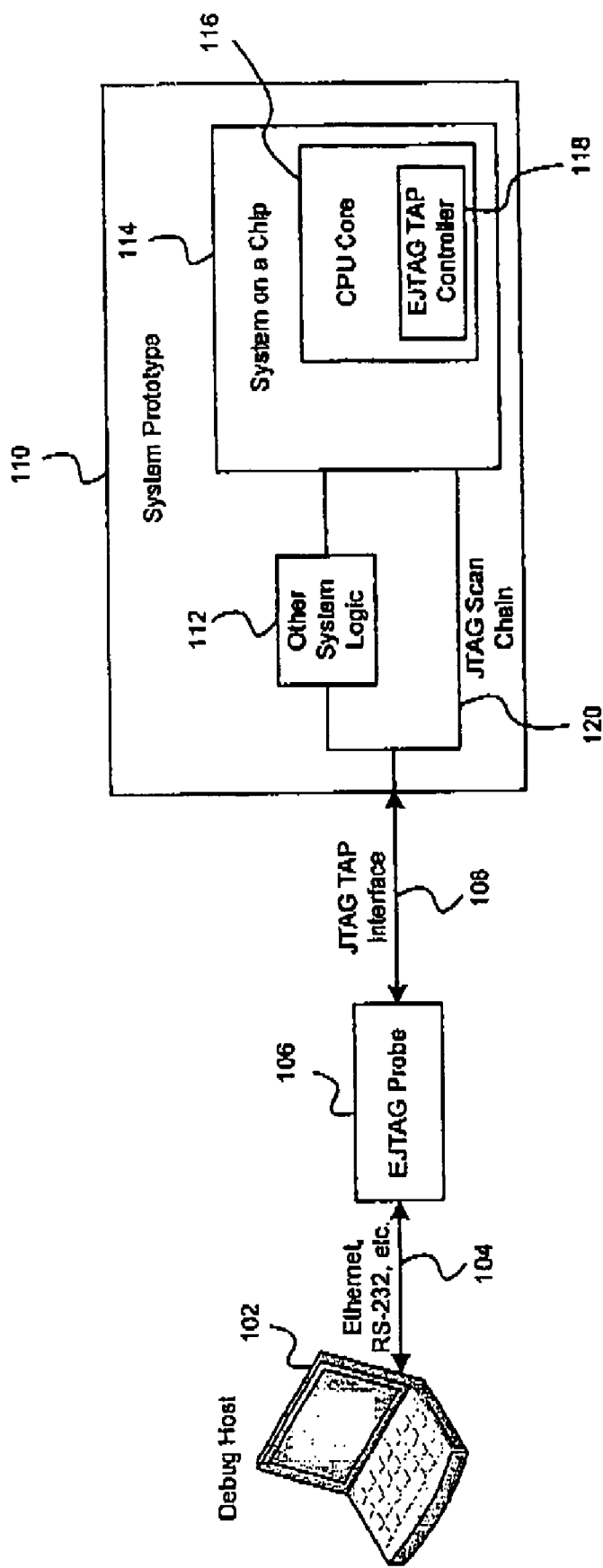
FIG. 1 is a block diagram of an exemplary debug system with EJTAG capability.

FIG. 1 is a block diagram of an exemplary debug system with EJTAG capability. Referring to FIG. 1 a debug system may comprise a debug host 102, an interface from the debug host 104, an EJTAG probe 108, a JTAG TAP interface 108, a system prototype 110, other system logic 112, a system on a chip (SOC) 114, a CPU core 116, an EJTAG TAP controller 118, and a JTAG scan chain, 120.

The debug host 104 may be a computer adapted to executing debugger software. The debug host 104 may provide a graphical user interface. The interface from the debug host 104 may be Ethernet, RS-232, or other suitable communications interface. The EJTAG probe 106 may adapt the debug host interface to a JTAG interface thereby providing the debug host 104 JTAG interface access to the system prototype 110, which may also be referred to as a debug "target system". In addition, the EJTAG probe 106 may perform the detailed tasks involved in monitoring the CPU on the target system during its execution. The JTAG TAP interface 108 may comprise the physical JTAG TAP interface as described in IEEE 1149.1-1990, cabling, connectors, and a header. The system prototype 110 may comprise other system logic 112, an SOC 114, and a JTAG scan chain, 120.

The system prototype 110 may provide a physical connector to which a header from the EJTAG probe may be connected to establish electrical continuity of signals and debug messages between the EJTAG probe 106 and the system prototype 110. The system prototype 110 may also comprise a JTAG scan chain 120. Other system logic 112 may comprise programmable logic, memory, combinatorial logic, and peripheral interface circuitry. Other system logic 112 may comprise a plurality of JTAG TAP interfaces which is coupled to the JTAG scan chain 120.

The SOC 114 may comprise a CPU core 116 in addition to programmable logic, memory, combinatorial logic, and other circuitry adapted to the specific application for which the SOC 114 is being utilized. The SOC 114 may comprise a JTAG TAP interface which is coupled to the JTAG scan chain 120. In addition, the SOC 114 may comprise an internal JTAG scan chain to which a CPU core 116 and other circuitry on the SOC 114 may be coupled. The internal JTAG scan chain within the SOC 114 may be coupled to the JTAG scan chain 120 for the system prototype 110. The CPU core may comprise an EJTAG TAP controller 118. The JTAG scan chain 120 may comprise a continuous debug path coupling a plurality of devices sharing the same chain. JTAG scan chains which are internal to devices on the system prototype 110 may also be coupled to the JTAG scan chain 120 to effectively form a single continuous debug path.

Figure 2:
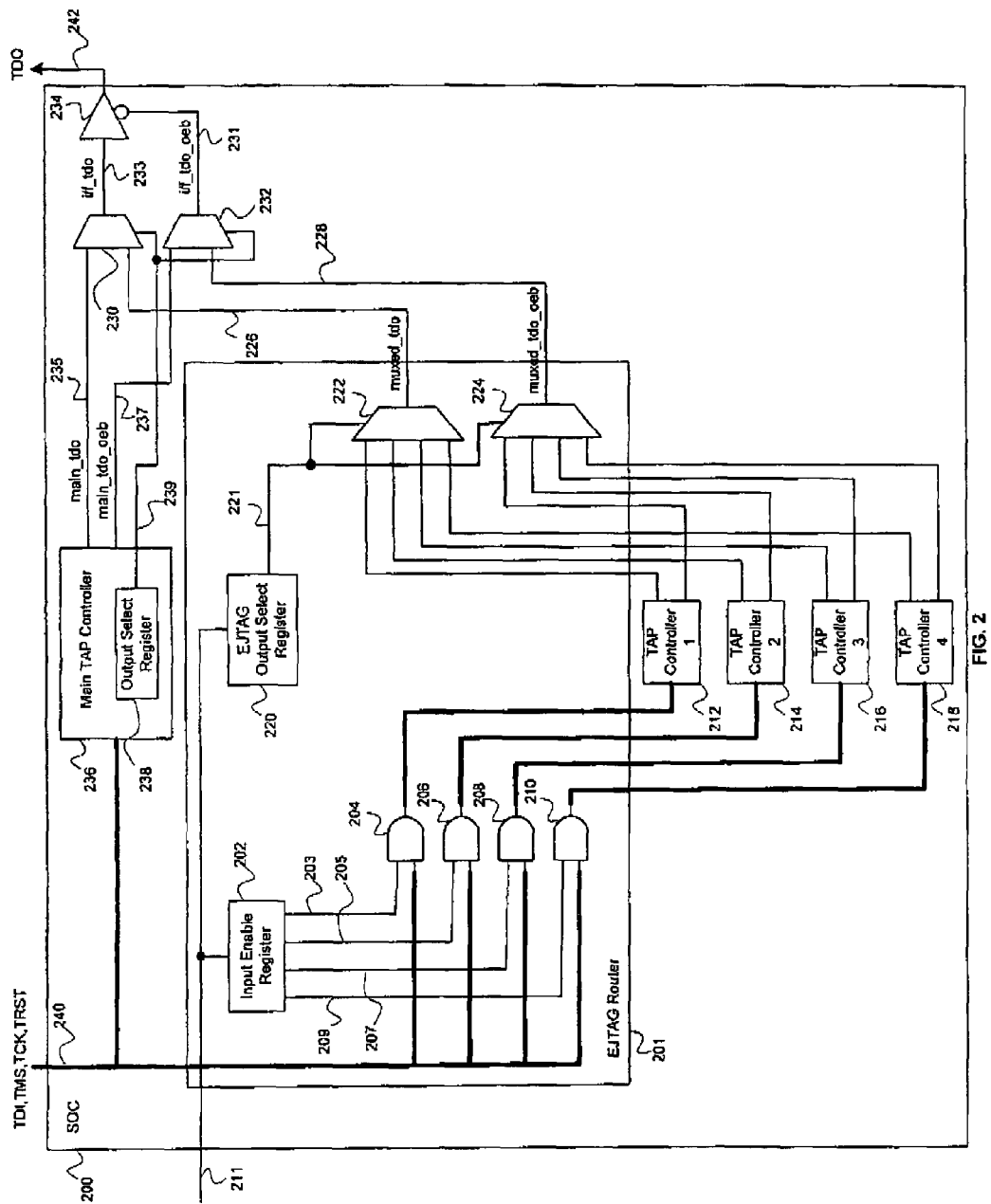
FIG. 2 is a block diagram of an exemplary system of using a single EJTAG interface for multiple TAP controllers, in accordance with an embodiment of the invention.

FIG. 2 is a block diagram of an exemplary system of using a single EJTAG interface for multiple TAP controllers, in accordance with an embodiment of the invention. Referring to FIG. 2, the SOC 200 may comprise an EJTAG router 201, input enable register 202, input enable signals 203, 205, 207, and 209, logical AND gates 204, 206, 208, and 210, TAP controllers 212, 214, 216, and 218, EJTAG output select register 220, EJTAG output select register signal 221, EJTAG router multiplexers 222 and 224, muxed TDO (muxed_tdo) message 226, muxed TDO output enable (muxed_tdo_oeb) signal 228, output multiplexers 230 and 232, buffer 234, main TAP controller 236, output control register 238, main TDO (main_tdo) message 235, main TDO output enable (main_tdo_oeb) signal 237, output select signal 239, interface TDO (i/f_tdo) message 233, interface TDO output enable (i/f_tdo_oeb) signal 231, a control signal 211, EJTAG inputs 240, and EJTAG output 242.

The SOC 200 provides an external JTAG interface and may be one IC device of a plurality of IC devices in a system. The SOC 200 may be coupled to a JTAG scan chain in the system. Internally, the SOC 200 may comprise a plurality of components which may be adapted to JTAG interfaces, with each such component comprising a JTAG TAP controller. The TAP controllers in these components may be daisy-chain coupled in a single JTAG scan ring. One of the plurality of JTAG TAP controllers may be designated as the main TAP controller 236. The SOC 200 may also comprise a plurality of components which may be adapted to a plurality of on-chip debugging interfaces which may include, but are not limited to, JTAG, and EJTAG. These components may not be daisy-chain coupled in a single scan chain. Instead, the debug interfaces from the TAP controllers of each of these components may be individually coupled to one of a plurality of interfaces to an EJTAG router 201.

The JTAG TAP interface to the SOC may comprise the EJTAG inputs 240, and EJTAG output 242. The EJTAG inputs 240 may be coupled to the EJTAG router 201 and to a JTAG TAP controller, which may be the main TAP controller 236, in the JTAG scan chain. The control signal 211, may also be coupled to the EJTAG router 201. Outputs from the main TAP controller 236 may comprise the main TDO (main_tdo) message 235, the main TDO output enable (main_tdo_oeb) signal 237, and the output select signal 239. Outputs from the EJTAG router 201 may comprise the muxed TDO (muxed_tdo) message 226 and the muxed TDO output enable (muxed_tdo_oeb) signal 228. The main TDO (main_tdo) message 235, and the muxed TDO (muxed_tdo) message 226 may be coupled to a multiplexer 230 on the SOC 200.

The main TDO output enable (main_tdo_oeb) signal 237 and the muxed TDO output enable (muxed_tdo_oeb) signal 228 may be coupled to a multiplexer 232 on the SOC 200. The output select signal 239 may be coupled to both multiplexers 230 and 232. The output of the multiplexer 230 may be the interface TDO (i/f_tdo) message 233. The output of the multiplexer 232 may be the interface TDO output enable (i/f_tdo_oeb) signal 231. The interface TDO (i/f_tdo) message 233 and the interface TDO output enable (i/f_tdo_oeb) signal 231 may be coupled to the buffer 234. The EJTAG output 242 may be coupled to the output of the buffer 234.

The EJTAG inputs 240 may comprise inputs to the JTAG TAP interface, TDI, TMS, TCLK, and TRST. The EJTAG output 242 may comprise the output from the JTAG TAP interface, TDO. The control signal 211 may comprise information which is utilized to control components within the SOC 200. The control signal 211 may arrive at the SOC 200 via an external interface such as the inter-integrated circuit ($I^2C$) interface, or the peripheral component interface (PCI) bus. The EJTAG router 201 may comprise the input enable register 202, the logical AND gates 204, 206, 208, and 210, the EJTAG output select register 220, and multiplexers 222 and 224.

An input to the input enable register 202 may be coupled to the control signal 211. The outputs from input enable register 202 may comprise the input enable signals 203, 205, 207, and 209. The control signal 211, may be adapted internally by the input enable register 202 to generate the input enable register control signal. The input enable register control signal may be adapted to enable zero or more of any of the input enable signals 203, 205, 207, and 209. The input enable signal 203 may be coupled to an input to the logical AND gate 204. When the input enable signal 203 indicates "enabled", the input to the logical AND gate 204, EJTAG inputs 240, may be coupled to an output from the EJTAG router which may be coupled to TAP controller 1, 212. When the input enable signal 203 indicates "disabled", the input to the logical AND gate 204, EJTAG inputs 240, may not be coupled to an output from the EJTAG router which may be coupled to TAP controller 1, 212.

The input enable signal 205 may be coupled to an input to the logical AND gate 206. When the input enable signal 205 indicates "enabled", the input to the logical AND gate 206, EJTAG inputs 240, may be coupled to an output from the EJTAG router which may be coupled to TAP controller 2, 214. When the input enable signal 205 indicates "disabled", the input to the logical AND gate 206, EJTAG inputs 240, may not be coupled to an output from the EJTAG router which may be coupled to TAP controller 2, 214. The input enable signal 207 may be coupled to an input to the logical AND gate 208. When the input enable signal 207 indicates "enabled", the input to the logical AND gate 208, EJTAG inputs 240, may be coupled to an output from the EJTAG router which may be coupled to TAP controller 3, 216. When the input enable signal 207 indicates "disabled", the input to the logical AND gate 208, EJTAG inputs 240, may not be coupled to an output from the EJTAG router which may be coupled to TAP controller 3, 216. The input enable signal 209 may be coupled to an input to the logical AND gate 210. When the input enable signal 209 indicates "enabled", the input to the logical AND gate 210, EJTAG inputs 240, may be coupled to an output from the EJTAG router which may be coupled to TAP controller 4, 218. When the input enable signal 209 indicates "disabled", the input to the logical AND gate 210, EJTAG inputs 240, may not be coupled to an output from the EJTAG router which may be coupled to TAP controller 4, 218.

Input enable signals 203, 205, 207, and 209 may be enabled or disabled independently such that at least a portion of the input enable signals may be simultaneously enabled. Similarly, at least a portion of the input enable signals 203, 205, 207, and 209 may be simultaneously disabled. Alternately, the plurality of input enable signals 203, 205, 207, and 209 may be simultaneously enabled, or simultaneously disabled. When at least a portion of a plurality of input enable signals is simultaneously enabled, the EJTAG router may broadcast a single debug message received via a single debug interface to a plurality of TAP controllers.

An input to the EJTAG output select register 220 may be coupled to the control signal 211. The control signal 211 may be adapted by the EJTAG output select register 220 to produce the EJTAG router output select register control signal 221. This signal may be adapted to select EJTAG router inputs, received from the plurality of TAP controllers 212, 214, 216, and 218, to be coupled to outputs 226 and 228 from the EJTAG router 201. Debug messages from TAP controllers 212, 214, 216, and 218 may be coupled to multiplexer 222. Output enable signals from TAP controllers 212, 214, 216, and 218 may be coupled to multiplexer 224. Based upon information received in the control signal 211, the EJTAG output control register 220 may generate an EJTAG output select register control signal 221, which instructs multiplexer 222 and 224 to select inputs received from TAP controller 1 212. This may result in multiplexer 222 coupling an input received from TAP controller 1 212 to the muxed TDO (muxed_tdo) message 226 output from the EJTAG router. This may also result in multiplexer 224 coupling an input received from TAP controller 1, 212 to the muxed TDO output enable (muxed_tdo_oeb) signal 228 output from the EJTAG router. Based upon information received in the control signal 211, the EJTAG output control register 220 may generate an EJTAG output select register control signal 221, which instructs multiplexer 222 and 224 to select inputs received from TAP controller 2 214. This may result in multiplexer 222 coupling an input received from TAP controller 2 214 to the muxed TDO (muxed_tdo) message 226 output from the EJTAG router. This may also result in multiplexer 224 coupling an input received from TAP controller 2 214 to the muxed TDO output enable (muxed_tdo_oeb) signal 228 output from the EJTAG router.

Based upon information received in the control signal 211, the EJTAG output control register 220 may generate an EJTAG output select register control signal 221, which instructs multiplexer 222 and 224 to select inputs received from TAP controller 3 216. This may result in multiplexer 222 coupling an input received from TAP controller 3 216 to the muxed TDO (muxed_tdo) message 226 output from the EJTAG router. This may also result in multiplexer 224 coupling an input received from TAP controller 3 216 to the muxed TDO output enable (muxed_tdo_oeb) signal 228 output from the EJTAG router. Based upon information received in the control signal 211, the EJTAG output control register 220 may generate an EJTAG output select register control signal 221, which instructs multiplexer 222 and 224 to select inputs received from TAP controller 4 218. This may result in multiplexer 222 coupling an input received from TAP controller 4 218 to the muxed TDO (muxed_tdo) message 226 output from the EJTAG router. This may also result in multiplexer 224 coupling an input received from TAP controller 4 218 to the muxed TDO output enable (muxed_tdo_oeb) signal 228 output from the EJTAG router.

The main TAP controller 236 may comprise an output select register 238. An input to the main TAP controller 236 may be coupled to the EJTAG inputs 240. The outputs from the main TAP controllers may include the main TDO (main_tdo) message 235, the main TDO output enable (main_tdo_oeb) signal 237, and the output select signal 239. An input to the output select register 238 may be coupled to the EJTAG inputs 240. The EJTAG inputs 240 may be adapted by the output select register 23B to generate the output select signal 239. The output select signal 239 may be coupled to the multiplexers 230 and 232. The output select signal 239 may enable the multiplexer 230 to couple the main TDO (main_tdo) message 235 input from the main TAP controller 236 to the interface TDO (i/f_tdo) message 233 output from the multiplexer 230, or the output select signal 239 may enable the multiplexer 230 to couple the muxed TDO (muxed_tdo) message 226 input from the EJTAG router 201 to the interface TDO (i/f_tdo) message 233 output from the multiplexer 230. The output select signal 239 may enable the multiplexer 232 to couple the main TDO output enable (main_tdo_oeb) signal 237 input from the main TAP controller 236 to the interface TDO output enable (i/f_tdo_oeb) signal 231 output from the multiplexer 232, or the output select signal 239 may enable the multiplexer 232 to couple the muxed TDO output enable (muxed_tdo_oeb) signal 228 input from the EJTAG router 201 to the interface TDO output enable (i/f_tdo_oeb) signal output 231 output from the multiplexer 232.

For example, if the debug message received from the EJTAG inputs 240 comprises a JTAG instruction, then the main TDO (main_tdo) message 235 may be coupled to the interface TDO (i/f_tdo) message 233. Additionally, the main TDO output enable (main_tdo_oeb) signal 237 may be coupled to the interface TDO output enable (i/f_tdo_oeb) signal 231. If, however, the debug message received from the EJTAG inputs 240 comprises an EJTAG instruction, then the muxed TDO (muxed_tdo) message 226 may be coupled to the interface TDO (i/f_tdo) message 233. Furthermore, the muxed TDO output enable (muxed_tdo_oeb) signal 228 may be coupled to the interface TDO output enable (i/f_tdo_oeb) signal 231.

The buffer 234 may utilize the interface TDO output enable (i/f_tdo_oeb) signal 231 to couple the interface TDO (i/f_tdo) message 233 to the EJTAG output 242. When the interface TDO output enable (i/f_tdo_oeb) signal 231 indicates "enabled", the interface TDO (i/f_tdo) message 233 may be coupled to the EJTAG output 242. When the interface TDO output enable (i/f_tdo_oeb) signal 231 indicates "disabled", the interface TDO (i/f_tdo) message 233 may not be coupled to the EJTAG output 242.

Figure 3:
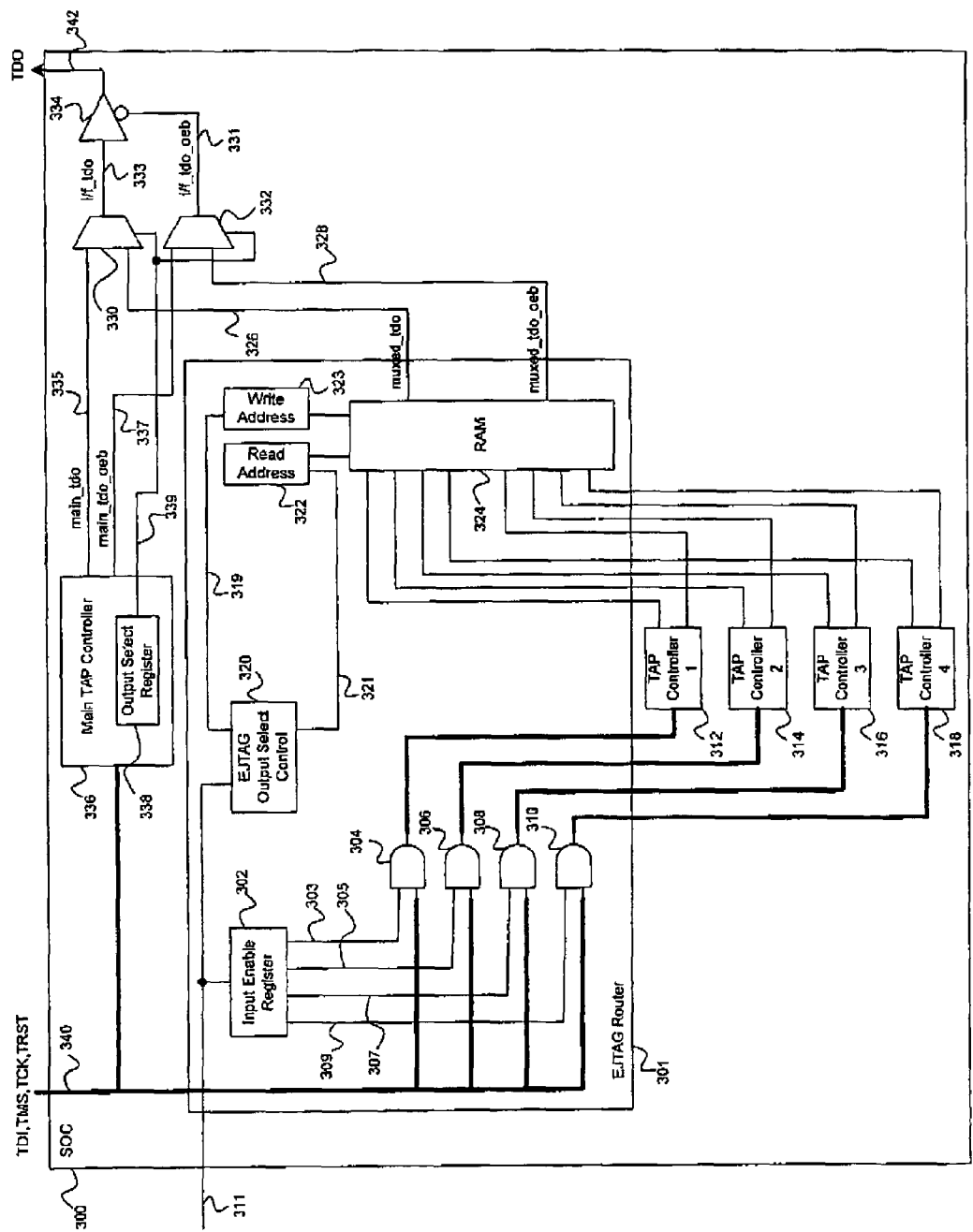
FIG. 3 is a block diagram of an alternative exemplary system of using a single EJTAG interface for multiple TAP controllers, in accordance with an embodiment of the invention.

FIG. 3 is a block diagram of an alternative exemplary system of using a single EJTAG interface for multiple TAP controllers, in accordance with an embodiment of the invention. Referring to FIG. 3, the SOC 300 may comprise an EJTAG router 301, input enable register 302, input enable signals 303, 305, 307, and 309, logical AND gates 304, 306, 308, and 310, TAP controllers 312, 314, 316, and 318, EJTAG output select control block 320, read address block 322, write address block 323, and random access memory (RAM) 324.

FIG. 3 also comprises write address control signal 319, read address control signal 321, muxed TDO (muxed_tdo) message 326, muxed TDO output enable (muxed_tdo_oeb) signal 328, output multiplexers 330 and 332, buffer 334, main TAP controller 336S output control register 338, Also illustrated in FIG. 3 is main TDO (main_tdo) message 335, main TDO output enable (main_tdo_oeb) signal 337, output select signal 339, interface TDO (i/f_tdo) message 333, interface TDO output enable (i/f_tdo_oeb) signal 331, a control signal 311, EJTAG inputs 340, and EJTAG output 342.

The SOC 300 provides an external JTAG interface and may be one IC device of a plurality of IC devices in a system. The SOC 300 may be coupled to a JTAG scan chain in the system. Internally, the SOC 300 may comprise a plurality of components which may be adapted to JTAG interfaces, with each such component comprising a JTAG TAP controller. The TAP controllers in these components may be daisy-chained in a single JTAG scan ring. One of the plurality of JTAG TAP controllers may be designated as the main TAP controller 336. The SOC 300 may also comprise a plurality of components which may be adapted to a plurality of on-chip debugging interfaces which may include, but are not limited to, JTAG, and EJTAG. These components may not be daisy-chained in a single scan chain. Instead, the debug interfaces from the TAP controllers of each of these components may be individually coupled to one of a plurality of interfaces to an EJTAG router 301.

The JTAG TAP interface to the SOC may comprise the EJTAG inputs 340, and EJTAG output 342. The EJTAG inputs 340 may be coupled to the EJTAG router 301 and to a JTAG TAP controller, which may be the main TAP controller 336, in the JTAG scan chain. The control signal 311, may also be coupled to the EJTAG router 301. Outputs from the main TAP controller 336 may comprise the main TDO (main_tdo) message 335, the main TDO output enable (main_tdo_oeb) signal 337, and the output select signal 339. Outputs from the EJTAG router 301 may comprise the muxed TDO (muxed_tdo) message 326 and the muxed TDO output enable (muxed_tdo_oeb) signal 328. The main TDO (main_tdo) message 335, and the muxed TDO (muxed_tdo) message 326 may be coupled to a multiplexer 330 on the SOC 300. The main TDO output enable (main_tdo_oeb) signal 337 and the muxed TDO output enable (muxed_tdo_oeb) signal 328 may be coupled to a multiplexer 332 on the SOC 300. The output select signal 339 may be coupled to both multiplexers 330 and 332. The output of the multiplexer 330 may be the interface TDO (i/f_tdo) message 333. The output of the multiplexer 332 may be the interface TDO output enable (i/f_tdo_oeb) signal 331. The interface TDO (i/f_tdo) message 333 and the interface TDO output enable (i/f_tdo_oeb) signal 331 may be coupled to the buffer 334. The EJTAG output 342 may be coupled to the output of the buffer 334.

The EJTAG inputs 340 may comprise inputs to the JTAG TAP interface, TDI, TMS, TCLK, and TRST. The EJTAG output 342 may comprise the output from the JTAG TAP interface, TDO. The control signal 311 may comprise information which is utilized to control components within the SOC 300. The control signal 311 may arrive at the SOC 200 via an external interface such as the inter-integrated circuit (I²C) interface, or the peripheral component interface (PCI) bus. The EJTAG router 301 may comprise the input enable register 302, the logical AND gates 304, 306, 308, and 310, the EJTAG output select register 320, and multiplexers 322 and 324.

An input to the input enable register 302 may be coupled to the control signal 311. The outputs from input enable register 302 may comprise the input enable signals 303, 305, 307, and 309. The control signal 311 may be adapted internally by the input enable register 302 to generate the input enable register control signal. The input enable register control signal may be adapted to enable zero or more of any of the input enable signals 303, 305, 307, and 309. The input enable signal 303 may be coupled to an input to the logical AND gate 304. When the input enable signal 303 indicates "enabled", the input to the logical AND gate 304, EJTAG inputs 340, may be coupled to an output from the EJTAG router which may be coupled to TAP controller 1 312. When the input enable signal 303 indicates "disabled", the input to the logical AND gate 304, EJTAG inputs 340, may not be coupled to an output from the EJTAG router which may be coupled to TAP controller 1 312. The input enable signal 305 may be coupled to an input to the logical AND gate 306. When the input enable signal 305 indicates "enabled", the input to the logical AND gate 306, EJTAG inputs 340, may be coupled to an output from the EJTAG router which may be coupled to TAP controller 2 314. When the input enable signal 305 indicates "disabled", the input to the logical AND gate 306, EJTAG inputs 340, may not be coupled to an output from the EJTAG router which may be coupled to TAP controller 2 314.

The input enable signal 307 may be coupled to an input to the logical AND gate 308. When the input enable signal 307 indicates "enabled", the input to the logical AND gate 308, EJTAG inputs 340, may be coupled to an output from the EJTAG router which may be coupled to TAP controller 3 316. When the input enable signal 307 indicates "disabled", the input to the logical AND gate 308, EJTAG inputs 340, may not be coupled to an output from the EJTAG router which may be coupled to TAP controller 3 316. The input enable signal 309 may be coupled to an input to the logical AND gate 310. When the input enable signal 309 indicates "enabled", the input to the logical AND gate 310, EJTAG inputs 340, may be coupled to an output from the EJTAG router which may be coupled to TAP controller 4 318. When the input enable signal 309 indicates "disabled", the input to the logical AND gate 310, EJTAG inputs 340, may not be coupled to an output from the EJTAG router which may be coupled to TAP controller 4 318.

Input enable signals 303, 305, 307, and 309 may be enabled or disabled independently such that at least a portion of the input enable signals may be simultaneously enabled. Similarly, at least a portion of the input enable signals 303, 305, 307, and 309 may be simultaneously disabled. Alternately, the plurality of input enable signals 303, 305, 307, and 309 may be simultaneously enabled, or simultaneously disabled. When at least a portion of a plurality of input enable signals is simultaneously enabled, the EJTAG router may broadcast a single debug message received via a single debug interface to a plurality of TAP controllers.

An input to the EJTAG output select control block 320 may be coupled to the control signal 311. The control signal 311 may be adapted by the EJTAG output select control block 320 to produce the read address control signal 321, and the write address control signal 319. The write address control signal 319 may be adapted to enable the RAM 324 to store the EJTAG router inputs which have been received simultaneously from the plurality of TAP controllers 312, 314, 316, and 318 at an address as specified by the write control address block 323. The read address control signal 321 may be adapted to enable the RAM 324 to select a previously stored EJTAG router 301 input which was received from one of the TAP controllers 312, 314, 316, or 318, to be coupled to outputs 326 and 328 from the EJTAG router 301, the muxed TDO (muxed_tdo) message 326, and the muxed TDO output enable (muxed_tdo_oeb) signal 328. For example, the write address block 323 may write information to the RAM 324 using long word addressing to simultaneously capture inputs from a plurality of TAP controllers 312, 314, 316, and 318 while the read address block 322 may read from the RAM 324 using octet or nibble addressing to retrieve a previously stored input received from a TAP controller.

The main TAP controller 336 may comprise an output select register 338. An input to the main TAP controller 336 may be coupled to the EJTAG inputs 340. The outputs from the main TAP controllers may include the main TDO (main_tdo) message 335, the main TDO output enable (main_tdo_oeb) signal 337, and the output select signal 339. An input to the output select register 338 may be coupled to the EJTAG inputs 340. The EJTAG inputs 340 may be adapted by the output select register 338 to generate the output select signal 339, The output select signal 339 may be coupled to the multiplexers 330 and 332. The output select signal 339 may enable the multiplexer 330 to couple the main TDO (main_tdo) message 335 input from the main TAP controller 336 to the interface TDO (i/f_tdo) message 333 output from the multiplexer 330, or the output select signal 339 may enable the multiplexer 330 to couple the muxed TDO (muxed_tdo) message 326 input from the EJTAG router 301 to the interface TDO (i/f_tdo) message 333 output from the multiplexer 330. The output select signal 339 may enable the multiplexer 332 to couple the main TDO output enable (main_tdo_oeb) signal 337 input from the main TAP controller 336 to the interface TDO output enable (i/f_tdo_oeb) signal 331 output from the multiplexer 332, or the output select signal 339 may enable the multiplexer 332 to couple the muxed TDO output enable (muxed_tdo_oeb) signal 328 input from the EJTAG router 301 to the interface TDO output enable (i/f_tdo_oeb) signal 331 output from the multiplexer 332.

For example, if the debug message received from the EJTAG inputs 340 comprises a JTAG instruction, then the main TDO (main_tdo) message 335 may be coupled to the interface TDO (i/f_tdo) message 333. Furthermore, the main TDO output enable (main_tdo_oeb) signal 337 may be coupled to the interface TDO output enable (i/f_tdo_oeb) signal 331. If, however, the debug message received from the EJTAG inputs 340 comprises an EJTAG instruction, then the muxed TDO (muxed_tdo) message 326 may be coupled to the interface TDO (i/f_tdo) message 333. Additionally, the muxed TDO output enable (muxed_tdo_oeb) signal 328 may be coupled to the interface TDO output enable (i/f_tdo_oeb) signal 331.

The buffer 334 may utilize the interface TDO output enable (i/f_tdo_oeb) signal 331 to couple the interface TDO (i/f_tdo) message 333 to the EJTAG output 342. When the interface TDO output enable (i/f_tdo_oeb) signal 331 indicates "enabled", the interface TDO (i/f_tdo) message 333 may be coupled to the EJTAG output 342. When the interface TDO output enable (i/f_tdo_oeb) signal 331 indicates "disabled", the interface TDO (i/f_tdo) message 333 may not be coupled to the EJTAG output 342.

Figure 4:
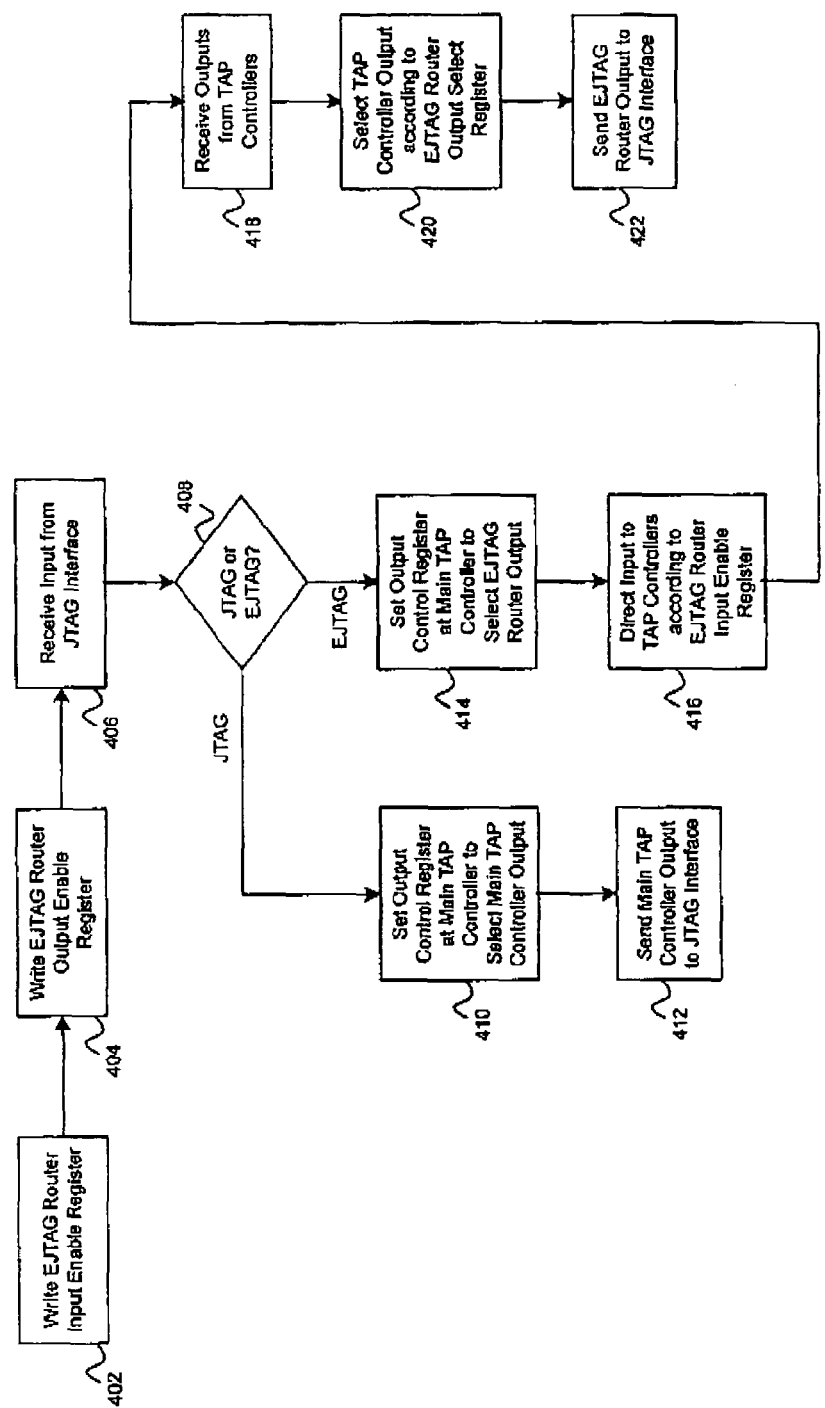
FIG. 4 is a flow chart illustrating exemplary steps in the operation of an exemplary system, in accordance with an embodiment of the invention.

FIG. 4 is a flow chart illustrating exemplary steps in the operation of an exemplary system in accordance with an embodiment of the invention. Referring to FIG. 4, in step 402 write EJTAG router input enable register. In step 404, EJTAG router output enable register may be written. In step 406, input may be received from JTAG interface. In step 408, it is determined if the received debug message is a JTAG instruction or an EJTAG instruction. If the received debug message in step 408 is a JTAG instruction, then in step 410, output control register at main TAP controller may be set to select main TAP controller outputs. In step 412, main TAP controller output may be sent to JTAG interface.

If in step 408, the received debug message was an EJTAG instruction then, in step 414, set output control register at main TAP controller to select EJTAG router output. In step 416, input to TAP controllers may be directed according to EJTAG router input enable register. In step 418 outputs from TAP controllers may be received. In step 420, TAP controller output may be selected according to EJTAG router output select register. In step 422, EJTAG router output may be sent to JTAG interface.

The EJTAG router enables multiple TAP controllers on an IC device to use a single JTAG interface. The EJTAG router adapts the single JTAG interface such that each of a plurality of TAP controllers may be the only components on distinct scan chains. In effect, the scan length of each of the plurality of TAP controllers coupled to the EJTAG router may be of the length of a single component. However, scan chains which are coupled to the EJTAG router may not comprise a plurality of components. In an exemplary system of using a single EJTAG interface for multiple TAP controllers in accordance with an embodiment of the invention, broadcast of debug messages received via a single debug interface to multiple TAP controllers may be achieved without requiring multiple debug interfaces and additional IC device pins. Consequently, the invention may enable faster debug access to devices and components in systems when compared to conventional methods of on-hip debug.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communicating information to a plurality of debugging interfaces, the method comprising:
performing by one or more circuits and/or processors:

receiving an input signal via a single debug interface at a main test controller and concurrently at an extended Joint Test Action Group JTAG (EJTAG) router;

determining whether said received input signal comprises a Joint Test Action Group (JTAG) instruction or an EJTAG instruction; and sending an output signal via said single debug interface from said main test controller or from said EJTAG router based on said determining.

2. The method according to claim 1, comprising sending said received input signal from said EJTAG router to selected test controllers among a plurality of test controllers.

3. The method according to claim 2, comprising generating an input enable register control signal that determines said selected test controllers.

4. The method according to claim 3, comprising generating said input enable register control signal within said EJTAG router based on a control signal.

5. The method according to claim 2, comprising simultaneously receiving a plurality of debug messages from at least a portion of said plurality of test controllers.

6. The method according to claim 5, comprising generating an output select register control signal that enables a selected one of said plurality of test controllers to generate said output signal from said EJTAG router.

7. The method according to claim 6, comprising generating said output select register control signal within said EJTAG router based on a control signal.

8. The method according to claim 5, comprising generating a write address that enables storing said simultaneously received plurality of debug messages.

9. The method according to claim 8, comprising generating a read address that enables a selected one of said stored simultaneously received debug messages to be used to generate said output signal from said EJTAG router.

10. The method according to claim 9, comprising generating said read address within said EJTAG router based on an external control signal.

11. The method according to claim 8, comprising generating said write address within said EJTAG router based on a control signal.

12. The method according to claim 1, comprising receiving and/or sending JTAG messages and/or Extended JTAG (EJTAG) messages via said single debug interface.

13. The method according to claim 1, comprising generating a main output select register control signal that enables said sending of said output signal from said main test controller or from said EJTAG router.

14. The method according to claim 13, comprising generating said main output select control signal within said main test controller.

15. A system for communicating information to a plurality of debugging interfaces, the system comprising:

one or more circuits comprising, a single debug interface, at least one main test controller, an EJTAG router and plurality of test controllers, said one or more circuits are operable to receive an input signal via said single debug interface at a main test controller and concurrently at an extended Joint Test Action Group (EJTAG) router;

said one or more circuits are operable to determine whether said received input signal comprises a Joint Test Action Group (JTAG) instruction or an EJTAG instruction; and said one or more circuits are operable to send an output signal via said single debug interface from said main test controller or from said EJTAG router based on said determining.

16. The system according to claim 15, wherein said one or more circuits are operable to send said received input signal from said EJTAG router to selected test controllers among a plurality of test controllers.

17. The system according to claim 16, wherein said one or more circuits are operable to generate an input enable register control signal that determines said selected test controllers.

18. The system according to claim 17, wherein said one or more circuits are operable to generate said input enable register control signal within said EJTAG router based on a control signal.

19. The system according to claim 16, wherein said one or more circuits are operable to simultaneously receive a plurality of debug messages from at least a portion of said plurality of test controllers.

20. The system according to claim 19, wherein said one or more circuits are operable to generate an output select register control signal that enables a selected one of said plurality of test controllers to generate said output signal from said EJTAG router.

21. The system according to claim 20, wherein said one or more circuits are operable to generate said output select register control signal within said EJTAG router based on a control signal.

22. The system according to claim 19, wherein said one or more circuits are operable to generate a write address that enables storing said simultaneously received plurality of debug messages.

23. The system according to claim 22, wherein said one or more circuits are operable to generate a read address that enables a selected one of said stored simultaneously received debug messages to be used to generate said output signal from said EJTAG router.

24. The system according to claim 23, wherein said one or more circuits are operable to generate said read address within said EJTAG router based on an external control signal.

25. The system according to claim 22, wherein said one or more circuits are operable to generate said write address within said EJTAG router based on a control signal.

26. The system according to claim 15, wherein said single debug interface is operable to receive and send JTAG messages, and Extended JTAG (EJTAG) messages.

27. The system according to claim 15, wherein said one or more circuits are operable to generate a main output select register control signal that enables said sending of said output signal from said main test controller or from said EJTAG router.

28. The system according to claim 27, wherein said one or more circuits are operable to generate said main output select control signal within said main test controller.

* * * * *

UNITED STATES PATENT AND TRADEMARK OFFICE
CERTIFICATE OF CORRECTION

| | | |
|---|---|---|
| PATENT NO. | : 7,650,542 B2 | Page 1 of 1 |
| APPLICATION NO. | : 11/013586 | |
| DATED | : January 19, 2010 | |
| INVENTOR(S) | : Sweet et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 771 days.

Signed and Sealed this
Tenth Day of April, 2012

David J. Kappos
*Director of the United States Patent and Trademark Office*